US008883402B2

(12) United States Patent
Fall et al.

(10) Patent No.: US 8,883,402 B2
(45) Date of Patent: Nov. 11, 2014

(54) PHOTOCURABLE COMPOSITIONS

(71) Applicant: 3M Innovative Properties Company, St. Paul, MN (US)

(72) Inventors: Douglas C. Fall, St. Paul, MN (US); Zai-Ming Qiu, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 44 days.

(21) Appl. No.: 13/921,763

(22) Filed: Jun. 19, 2013

(65) Prior Publication Data
US 2014/0044932 A1 Feb. 13, 2014

Related U.S. Application Data

(60) Provisional application No. 61/681,393, filed on Aug. 9, 2012.

(51) Int. Cl.
G03F 7/027 (2006.01)
G03F 7/09 (2006.01)
G03F 7/20 (2006.01)
B41M 5/00 (2006.01)

(52) U.S. Cl.
USPC ............ 430/281.1; 430/284.1; 430/311; 430/396; 428/195.1

(58) Field of Classification Search
USPC ........ 430/270.1, 281.1, 284.1, 311, 322, 396; 428/195.1
See application file for complete search history.

(56) References Cited

U.S. PATENT DOCUMENTS

| 2,716,102 | A | 8/1955 | Unruh |
| 2,940,853 | A | 6/1960 | Sagura |
| 3,046,110 | A | 7/1962 | Schmidt |
| 3,046,112 | A | 7/1962 | Schmidt |
| 3,046,119 | A | 7/1962 | Sus |
| 3,046,121 | A | 7/1962 | Schmidt |
| 3,106,465 | A | 10/1963 | Neugebauer |
| 3,149,975 | A | 9/1964 | Notley |
| 3,869,292 | A | 3/1975 | Peters |
| 4,148,655 | A | 4/1979 | Itoh |
| 4,180,404 | A | 12/1979 | Ohmura |
| 4,262,072 | A | 4/1981 | Wendling |
| 4,377,631 | A | 3/1983 | Toukhy |
| 4,404,272 | A | 9/1983 | Stahlhofen |
| 4,588,670 | A | 5/1986 | Kelly |
| 4,596,763 | A | 6/1986 | DiCarlo |
| 4,788,339 | A * | 11/1988 | Moore et al. ............... 564/457 |
| 4,888,269 | A | 12/1989 | Sato |
| 4,902,726 | A | 2/1990 | Hayashi |
| 5,009,982 | A | 4/1991 | Kamayachi |
| 5,034,304 | A | 7/1991 | Feely |
| 5,055,378 | A | 10/1991 | Miyamura |
| 5,061,744 | A | 10/1991 | Ogitani |
| 5,753,722 | A | 5/1998 | Itokawa |
| 5,770,347 | A | 6/1998 | Saitoh |
| 5,948,514 | A | 9/1999 | Komori |
| 6,664,354 | B2 | 12/2003 | Savu |
| 7,601,228 | B2 | 10/2009 | Nishina |
| 7,718,264 | B2 | 5/2010 | Klun |
| 7,897,678 | B2 | 3/2011 | Qiu |
| 8,015,970 | B2 | 9/2011 | Klun |
| 8,481,114 | B2 | 7/2013 | Keary |
| 8,715,904 | B2 * | 5/2014 | Qiu et al. ............... 430/270.1 |
| 8,748,060 | B2 * | 6/2014 | Qiu ............................ 430/5 |
| 2009/0163615 | A1 | 6/2009 | Halahmi |
| 2010/0048757 | A1 | 2/2010 | Okada |
| 2011/0008733 | A1 | 1/2011 | Qiu |
| 2011/0027702 | A1 | 2/2011 | Qiu |
| 2012/0171433 | A1 * | 7/2012 | Qiu ............................ 428/195.1 |

FOREIGN PATENT DOCUMENTS

| EP | 0 232 972 | 9/1993 |
| EP | 1 411 073 | 4/2004 |
| EP | 1 995 260 | 11/2008 |
| WO | WO 2009114580 A2 * | 9/2009 |

OTHER PUBLICATIONS

DeForest, "Types of Photoresists," Photoresist: Materials and Processes, Chapter 2, pp. 19-62, McGraw-Hill Book Company, New York, 1975.
Moreau, "Positive Photoresists," Semiconductor Lithography: Principles, Practices and Materials, Chapter 2, pp. 29-79, Plenum Press, New York, 1988.
Moreau, "Positive Photoresists," Semiconductor Lithography: Principles, Practices and Materials, Chapter 4, pp. 157-210, Plenum Press, New York, 1988.

* cited by examiner

Primary Examiner — Amanda C. Walke
(74) Attorney, Agent, or Firm — Kent S. Kokko

(57) ABSTRACT

A photocurable composition comprising a photoresist component, and an ethylenically unsaturated perfluoropolyether is disclosed. The composition enables easier release of phototool from a photoresist.

21 Claims, No Drawings

PHOTOCURABLE COMPOSITIONS

BACKGROUND

In printed circuit industry, photographic masks or stencils bearing a circuit pattern on a transparent substrate are known as phototools. Such a stencil, through which a photoresist can be selectively exposed by controlled irradiation as designed, provides an intricate complex image representing an electrical circuit. The image often consists of many fine lines and junctions spaced closely together as the advance of technology for higher resolution and smaller PCB size. During its use to make printed circuit boards, the phototool is placed face down on a photoresist layer and a contact print is made by exposing the photoresist to light, typically UV light, through the phototool, followed by separation of the phototool from the exposed photoresist layer. In this way, a single phototool can be repeatedly used to make multiple contact prints.

The continued use of the phototool can cause tiny scratches and abrasions on the phototool surface. The photoresists on which the phototool is placed are usually laminated on sheet copper (or other vapor-deposited copper substrates) and small burrs or rough edges of the copper sheet can cause scratches as the phototool is transferred from one photoresist to the next. The phototool is also frequently wiped with a soft cloth to make sure it is dust and lint free. Small particles of dirt can cause scratching as they are wiped across the phototool surface. Because of this general wear and tear on the phototool surfaced during normal use, the phototool must be frequently inspected to ensure line continuity. Depending upon the size and the intricacy of the phototool, such microscopic inspections can take 2 to 3 hours.

Ideally, the phototool must be cleanly removable from the exposed photoresist to prevent any transferring of photoresist to phototool and minimize contamination of the phototool. Various means of protecting the phototool have been described.

Due to the fact that phototools are vulnerable to scratching and that abrasion is a serious problem during the normal use of a phototool, protective films and overcoats having release performance are often employed to protect the phototool and allow repeated use of the phototool. For example, polysiloxane films coated with various kinds of pressure sensitive adhesives have been laminated to image-bearing surfaces of the phototool to protect the image and provide smooth release from photoresist. Because of their thickness required for the laminating process and minimized protection, however, the laminating films can cause optical distortion and only be used for PCB requiring limited resolution. In addition, the polysiloxane films are relatively soft and thus provide only limited scratch protection.

Thinner and harder protective coatings can be obtained by coating the surfaces of phototools with liquid compositions. Then, the thin liquid coating is hardened to yield the desired protective coat with improved scratch resistance. Epoxy silanes and acrylate esters (for example, polyurethane acrylates) have been used as protective hard coatings because of their resistance to abrasion. Many of these protective overcoats have limited release properties, however, and can therefore stick to the surface of the photoresist even when additional slipping agents are used, particularly when sticky photoresist materials such as high viscosity solder mask inks are present.

U.S. 2011/008733 and U.S. 2011/027702 (Qiu et al.) describe a hardcoat composition to be applied to the phototool with reduced surface energy for improved durable release from photoresist that comprises (a) one or more epoxy silane compounds, (b) one or more epoxy-functionalized perfluoropolyether acrylate oligomers, and (c) photoacid generator. Applicant's copending application U.S. Ser. No. 61/549,138, filed 19 Oct. 2011, describes hardcoat compositions comprising (a) an epoxy silane compound, (b) a reactive silicone additive, and (c) photo-acid generator for phototool protection and release performance.

Alternative approach for easier release of phototool from photoresist for repeated use is having low surface energy photoresist, which can be achieved by using low surface energy additive in photoresist.

SUMMARY

In view of the foregoing, we recognize that there is a need for photoresist compositions that can be cured by exposure to actinic radiation, and that release easily from the phototool even when sticky materials such as high viscosity solder masks are present.

The present disclosure provides a low surface energy photoresist composition that comprises a perfluoropolyether urethane compound with curable (meth)acryloyl group. When compounded with a acrylate based photoresist composition, the formulation enable the manufacture of circuits by affixing a phototool on a photoresist layer, exposing the photoresist layer with the phototool to high intensity light, easily removing the phototool from the photoresist layer comprising the copolymer, and developing the light exposed photoresist under normal conditions for final product, such as printed circuit broad. The protective solder masks with low surface energy property may provide improved protection for printed circuit boards from moisture and liquid repellency.

"Acryloyl" is used in a generic sense and mean not only derivatives of acrylic acid, but also amine, thiol and alcohol derivatives, respectively;

"(Meth)acryloyl" includes both acryloyl and methacryloyl groups; i.e. is inclusive of both esters, thioesters and amides.

"Alkyl" means a linear or branched, cyclic or acyclic, saturated monovalent hydrocarbon having from one to about 28, preferably one to 12, carbon atoms, e.g., methyl, ethyl, 1-propyl, 2-propyl, pentyl, and the like.

"Alkylene" means a linear saturated divalent hydrocarbon having from one to about twelve carbon atoms or a branched saturated divalent hydrocarbon radical having from three to about twelve carbon atoms, e.g., methylene, ethylene, propylene, 2-methylpropylene, pentylene, hexylene, and the like.

"Heteroalkyl" includes both straight-chained, branched, and cyclic alkyl groups with one or more heteroatoms independently selected from S, P, Si, O, and N with both unsubstituted and substituted alkyl groups. Unless otherwise indicated, the heteroalkyl groups typically contain from 1 to 20 carbon atoms. "Heteroalkyl" is a subset of "hydrocarbyl containing one or more S, N, O, P, or Si atoms" described below. Examples of "heteroalkyl" as used herein include, but are not limited to, methoxy, ethoxy, propoxy, 3,6-dioxaheptyl, 3-(trimethylsilyl)-propyl, 4-dimethylaminobutyl, and the like. Unless otherwise noted, heteroalkyl groups may be mono- or polyvalent, i.e. monovalent heteroalkyl or polyvalent heteroalkylene.

"Aryl" is an aromatic group containing 6-18 ring atoms and can contain optional fused rings, which may be saturated, unsaturated, or aromatic. Examples of an aryl groups include phenyl, naphthyl, biphenyl, phenanthryl, and anthracyl. Heteroaryl is an aryl containing 1-3 heteroatoms such as nitrogen, oxygen, or sulfur and can contain fused rings. Some examples of heteroaryl groups are pyridyl, furanyl, pyrrolyl, thienyl, thiazolyl, oxazolyl, imidazolyl, indolyl, benzofuranyl, and benzthiazolyl. Unless otherwise noted, aryl and heteroaryl groups may be mono- or polyvalent, i.e. monovalent aryl or polyvalent arylene.

"(Hetero)hydrocarbyl" is inclusive of hydrocarbyl alkyl and aryl groups, and heterohydrocarbyl heteroalkyl and heteroaryl groups, the later comprising one or more catenary oxygen heteroatoms such as ether or amino groups. Heterohydrocarbyl may optionally contain one or more catenary (in-chain) functional groups including ester, amide, urea, urethane, and carbonate functional groups. Unless otherwise indicated, the non-polymeric (hetero)hydrocarbyl groups typically contain from 1 to 60 carbon atoms. Some examples of such heterohydrocarbyls as used herein include, but are not limited to, methoxy, ethoxy, propoxy, 4-diphenylaminobutyl, 2-(2'-phenoxyethoxy)ethyl, 3,6-dioxaheptyl, 3,6-dioxahexyl-6-phenyl, in addition to those described for "alkyl", "heteroalkyl", "aryl", and "heteroaryl" supra.

"Polyisocyanate" means a compound containing an average of greater than one, preferably two or more isocyanate groups, —NCO, attached to a multivalent organic group, e.g. hexamethylene diisocyanate, the biuret and isocyanurate of hexamethylene diisocyanate, and the like.

"Residue" means that part of the original organic molecule remaining after reaction. For example, the residue of a polyisocyanate such as hexamethylene diisocyanate is —$C_6H_{12}$—.

"Perfluoroalkyl" has essentially the meaning given above for "alkyl" except that all or essentially all of the hydrogen atoms of the alkyl radical are replaced by fluorine atoms and the number of carbon atoms is from 1 to about 12, e.g. perfluoropropyl, perfluorobutyl, perfluorooctyl, and the like.

"Perfluoroalkylene" has essentially the meaning for "alkylene" except that all or essentially all of the hydrogen atoms of the alkylene radical are replaced by fluorine atoms, e.g., perfluoropropylene, perfluorobutylene, perfluorooctylene, and the like "Perfluorooxyalkyl" has essentially the meaning for "oxyalkyl" except that all or essentially all of the hydrogen atoms of the oxyalkyl radical are replaced by fluorine atoms and the number of carbon atoms is from 3 to about 100, e.g. $CF_3CF_2OCF_2CF_2$—, $CF_3CF_2O(CF_2CF_2O)_3CF_2CF_2$—, $C_3F_7O(CF(CF_3)CF_2O)_sCF(CF_3)CF_2$—, where s is (for example) from about 1 to about 50, and the like.

"Perfluorooxyalkylene" has essentially the meaning for "oxyalkylene" except that all or essentially all of the hydrogen atoms of the oxyalkylene radical are replaced by fluorine atoms, and the number of perfluorooxyalkylene unit carbon atoms is from 1 to 10 and the total number of perfluoropolyether carbon atoms is from 5 to about 100, e.g., the unit of perfluorooxyalkylene is selected from —$CF_2OCF_2$—, —$[CF_2$—$O]_r$—, —$[CF_2$—$CF_2$—$O]_r$—, —$[CF(CF_3)$—$CF_2$—$O]_r$— or their combination, —$[CF_2$—$CF_2$—$O]_r$—$[CF(CF_3)$—$CF_2$—$O]_s$—; wherein r and s are (for example) integers of 1 to 50.

DETAILED DESCRIPTION

The instant disclosure provides a photocurable composition comprising:

a) a photoresist component, b) a perfluoropolyether compound of the formula:

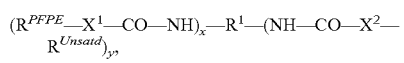
I

Where $R^{PFPE}$ represents a perfluoropolyether-containing group, $X^1$ and $X^2$ are independently —O—, —S— or —$NR^2$— where $R^2$ is H or $C_1$-$C_4$ alkyl, $R^1$ is a residue of a polyisocyanate having a valence of x+y, $R^{Unsatd}$ is a moiety containing an ethylenically unsaturated, polymerizable group, subscripts x and y are each independently 1 to 6, and c) a photoinitiator.

The perfluoropolyether compound of Formula I may be prepared by the reaction of a polyisocyanate having two or more isocyanate groups with 1) a perfluoropolyether compound having a nucleophilic, isocyanate-reactive, functional group, and 2) an ethylenically unsaturated compound having a nucleophilic, isocyanate-reactive, functional group as indicated in the following Scheme:

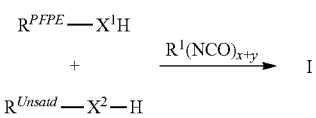

The perfluoropolyether compound of Formula I comprises, in part, the reaction product of a polyisocyanate compound with at least one nucleophilic perfluoropolyether compound having a monofunctional perfluoropolyether group, and at least one nucleophilic, isocyanate-reactive functional group. Such compounds include those of the formula:

$R^{PFPE*}$-Q-$X^1$H,     (II)

where $R^{PFPE*}$ is a monovalent perfluoropolyether group of the $R^{PFPE}$ group of formula I, Q is a divalent alkylene group, said alkylene optionally containing one or more catenary (in-chain) nitrogen or oxygen atoms, and optionally containing one or more sulfonamide, carboxamido, or carboxy functional group, preferably, Q is selected from —$CH_2$—, $C(O)NR^2CH_2CH_2$—, —$CF_2OCH_2CH_2$—, —$CF_2OCH_2CH_2CH_2$—, —$CH_2CH_2$— and —$CH_2OCH_2CH_2$—;

$X^1$H is an isocyanate-reactive group, wherein $X^1$ is selected from —O—, —$NR^2$—, or —S—, where $R^2$ is H or $C_1$-$C_4$ alkyl.

With respect to Formulas I and II, the reaction between the nucleophilic perfluoropolyether compound (II) and an isocyanate group of a polyisocyanate produces a urea-, thiourea or urethane-linked fluorine-containing group of the formula:

$(R^{PFPE*}$-Q-$X^1$—CO—NH)$_x$—$R^1$—(NCO)$_y$,   (III)

where $X^1$ is selected from —O—, —$NR^2$—, or —S—, where $R^2$ is H or $C_1$-$C_4$ alkyl, x is 1-6 and (x+y) is the number of isocyanate groups of the starting polyisocyanate. One such reaction is illustrated in Formula III, and reactions with additional isocyanate groups are contemplated.

The perfluoropolyether groups of Formula I to III can contain straight chain, or branched chain or perfluorooxyalkylene or perfluorooxyalkyl groups or any combination thereof. The perfluoropolyether groups are monovalent and fully-fluorinated groups are generally preferred, but hydrogen or other halo atoms can also be present as substituents, provided that no more than one atom of either is present for every two carbon atoms.

It is additionally preferred that any perfluoropolyether groups contain at least about 40% fluorine by weight, more preferably at least about 50% fluorine by weight. The terminal portion of the monovalent $R^{PFPE*}$ group is generally fully-fluorinated, preferably containing at least three fluorine atoms, e.g., $CF_3$—, $CF_3CF_2$—, $CF_3CF_2CF_2$—, $(CF_3)_2N$—, $(CF_3)_2CF$—, $SF_5CF_2$—. Generally the $R^{PFPE}*$ groups has an average $M_w$ of at least 500, preferred at least 800.

Useful perfluoropolyether perfluoropolyether groups correspond to the formula:

  (IV)

wherein $R_f^1$ represents a perfluoroalkyl group, $R_f^2$ represents a $C_1$-$C_4$ perfluoroalkyleneoxy groups or a mixture thereof, $R_f^3$ represents a perfluoroalkylene group and q is 0 to 1.

A typical monovalent perfluoroalkyl group $R_f^1$ is $CF_3$—$CF_2$—$CF_2$— and a typical divalent perfluoroalkylene $R_f^3$ is —$CF_2$—$CF_2$—$CF_2$—, —$CF_2$— or —$CF(CF_3)CF_2$—. Examples of perfluoroalkyleneoxy groups $R_f^2$ include: —$CF_2$—$CF_2$—O—, —$CF(CF_3)$—$CF_2$—O—, —$CF_2$—$CF(CF_3)$—O—, —$CF_2$—$CF_2$—$CF_2$—O—, —$CF_2$—O—, —$CF(CF_3)$—O—, and —$CF_2$—$CF_2$—$CF_2$—$CF_2$—O—.

The perfluoroalkyleneoxy group $R_f^2$ may be comprised of the same perfluorooxyalkylene units or of a mixture of different perfluorooxyalkylene units. When the perfluorooxyalkylene group is composed of different perfluoroalkylene oxy units, they can be present in a random configuration, alternating configuration or they can be present as blocks. Typical examples of perfluorinated poly(oxyalkylene) groups include: —$[CF_2$—$O]_r$—; —$[CF_2$—$CF_2$—$O]_r$—; —$[CF(CF_3)$—$CF_2$—$O]_s$—; —$[CF_2CF_2$—$O]_r$—$[CF_2O]_t$—, —$[CF_2CF_2CF_2CF_2$—$O]_u$ and —$[CF_2$—$CF_2$—$O]_r$—$[CF(CF_3)$—$CF_2$—$O]_s$—; wherein each of r, s, t and u each are integers of 1 to 50, preferably 2 to 25. A preferred perfluorooxyalkyl group that corresponds to formula (IV) is $CF_3$—$CF_2$—$CF_2$—O—$[CF(CF_3)$—$CF_2O]_s$—$CF(CF_3)CF_2$— wherein s is an integer of 2 to 25.

Perfluorooxyalkyl and perfluoroxyalkylene compounds can be obtained by oligomerization of hexafluoropropylene oxide that results in a terminal carbonyl fluoride group. This carbonyl fluoride may be converted into an acid, ester, iodide or alcohol by reactions well known to those skilled in the art. The carbonyl fluoride or acid, ester or alcohol derived therefrom may then be reacted further to introduce the desired isocyanate reactive groups according to known procedures.

For example, an acid, acid fluoride or ester can be reduced to a —$CH_2$—OH group (with e.g. $LiAlH_4$, $NaBH_4$) which may be a suitable isocyanate reactive functional group, or the hydroxyl group may be further converted into another isocyanate reactive group or extended with ethylene oxide unit.

PFPE-C(O)—OR+$NaBH_4$→PFPE-$CH_2$OH or

PFPE-C(O)—OR+$NH_2CH_2CH_2$OH→PFPE-C(O) $NHCH_2CH_2$OH or

PFPE-C(O)F+ethylenesulfate+$M^+F^-$→PFPE-$CF_2$— $OCH_2CH_2$OH.

The acid, acid fluoride or ester may be converted to an iodide, that may be reacted with an olefin such as ethylene to produce a —$CH_2CH_2$—I, which may be converted to an isocyanate reactive functional group by nucleophile displacement as well known in literature:

PFPE-C(O)F+LiI→PFPE-I→PFPE-$CH_2CH_2$I→PFPE-$CH_2CH_2$—$X^1$H

PFPE-$CO_2$Ag+$I_2$→PFPE-I

With respect to Formula I to IV, monofunctional perfluoropolyether compounds include monoalcohols, monomercaptans and monoamines Representative examples of useful fluorochemical monofunctional compounds include the following: $C_4F_9OC_2F_4OCF_2CH_2OCH_2CH_2OH$; $C_4F_9OC_2F_4OCF_2CF_2OCH_2CH_2OH$; $C_3F_7O(CF(CF_3)CF_2O)_{1-36}CF(CF_3)C(O)N(H)CH_2CH_2OH$; $C_3F_7O(CF(CF_3)CF_2O)_{1-36}CF(CF_3)CH_2OH$; $C_3F_7O(CF(CF_3)CF_2O)_{1-36}CF(CF_3)C(O)N(H)CH_2CH_2NHCH_3$; $C_3F_7O(CF(CF_3)CF_2O)_{1-36}CF(CF_3)C(O)N(H)CH_2CH_2OC(O)CH_2SH$; $C_3F_7O(CF(CF_3)CF_2O)_{1-36}CF(CF_3)C(O)N(H)CH_2CH_2OC(O)CH_2CH_2SH$ and the like, and mixtures thereof. If desired, other isocyanate-reactive functional groups may be used in place of those depicted.

The perfluoropolyether compounds of Formula I comprises, in part, the reaction product of a polyisocyanate compound with at least one nucleophilic ethylenically unsaturated compound with at least one primary or secondary nucleophilic, isocyanate-reactive groups per molecule, and at least one ethylenically unsaturated, free radically polymerizable group, including vinyl, allyl and (meth)acryloyl groups. In preferred embodiments the ethylenically unsaturated group is (methy)acryloyl, including (meth)acrylate (meth) thioacrylate and (meth)acrylamide groups.

The ethylenically unsaturated compound is of the general formula:

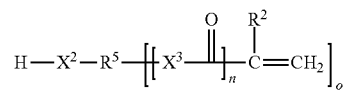  V wherein
$X^2$ is —O—, —S— or —$NR^2$—,
$R^2$ is H or $C_1$-$C_4$ alkyl,
$R^5$ is a polyvalent alkylene or arylene groups, or combinations thereof, said alkylene groups optionally containing one or more catenary oxygen atoms;
n is 0 or 1, and
o is 1 to 5.

Preferably the ethylenically unsaturated group of ethylenically unsaturated compound is a (meth)acryloyl group, including (meth)acrylates, (meth)thioacrylates and (meth) acrylamides. These are depicted in Formula V where n=1. Most preferably the ethylenically unsaturated group is an acrylate group: "nucleophilic (meth)acrylate compounds".

Useful nucleophilic (meth)acrylate compounds include, for example, (meth)acrylate compounds selected from the group consisting of (a) mono(meth)acrylate containing compounds such as hydroxyethyl (meth)acrylate, glycerol mono (meth)acrylate 1,3-butylene glycol mono(meth)acrylate, 1,4-butanediol mono(meth)acrylate, 1,6-hexanediol mono(meth) acrylate, alkoxylated aliphatic mono(meth)acrylate, cyclohexane dimethanol mono(meth)acrylate, alkoxylated hexanediol mono(meth)acrylate, alkoxylated neopentyl glycol mono(meth)acrylate, caprolactone modified neopentylglycol hydroxypivalate (meth)acrylate, caprolactone modified neopentylglycol hydroxypivalate mono(meth)acrylate, diethylene glycol mono(meth)acrylate, dipropylene glycol mono(meth)acrylate, ethoxylated bisphenol-A mono(meth) acrylate, hydroxypivalaldehyde modified trimethylolpropane mono(meth)acrylate, neopentyl glycol mono(meth)acrylate, propoxylated neopentyl glycol mono(meth)acrylate, tetraethylene glycol mono(meth)acrylate, tricyclodecanedimethanol mono(meth)acrylate, triethylene glycol mono(meth)acrylate, tripropylene glycol mono(meth)acrylate; (b) multiacryloyl-containing compounds such as glycerol di(meth)acrylate, ethoxylated tria(meth)crylates (e.g., ethoxylated trimethylolpropane di(meth)acrylate), pentaerythritol tri(meth)acrylate, propoxylated di(meth)acrylates (e.g., propoxylated (3) glyceryl di(meth)acrylate, propoxylated (5.5) glyceryl di(meth)acrylate, propoxylated (3) trimethylolpropane di(meth)acrylate, propoxylated (6) trimethylolpropane di(meth)acrylate), trimethylolpropane di(meth)acrylate, higher functionality (meth)acryl containing compounds such as di-trimethylolpropane tetra(meth)acrylate, and dipentaerythritol penta(meth)acrylate.

Such compounds are widely available from vendors such as, for example, Sartomer Company, Exton, Pa.; UCB Chemicals Corporation, Smyrna, Ga.; and Aldrich Chemical Company, Milwaukee, Wis. Additional useful acrylate materials include dihydroxyhydantoin moiety-containing polyacrylates, for example, as described in U.S. Pat. No. 4,262,072 (Wendling et al.).

With respect to the exemplary nucleophilic (meth)acryloyl compounds, it will be understood that the corresponding (meth)acrylamides and (meth)tioacrylates may be used.

Polyols useful in the preparation of the nucleophilic (meth) acryloyl compounds (partially (meth)acrylated polyols) include aliphatic, cycloaliphatic, or alkanol-substituted arene polyols, or mixtures thereof having from about 2 to about 18 carbon atoms and two to five, preferably two to four hydroxyl groups.

Examples of useful (meth)acrylated polyols include mono- or poly (meth)acryloyl derivatives of 1,2-ethanediol, 1,2-propanediol, 1,3-propanediol, 1,4-butanediol, 1,3-butanediol, 2-methyl-1,3-propanediol, 2,2-dimethyl-1,3-propanediol, 2-ethyl-1,6-hexanediol, 1,5-pentanediol, 1,6-hexanediol, 1,8-octanediol, neopentyl glycol, glycerol, trimethylolpropane, 1,2,6-hexanetriol, trimethylolethane, pentaerythritol, quinitol, mannitol, sorbitol, diethlene glycol, triethylene glycol, tetraethylene glycol, 2-ethyl-2-(hydroxymethyl)-1,3-propanediol, 2-ethyl-1,3-pentanediol, 1,4-cyclohexanedimethanol, 1,4-benzenedimethanol, and polyalkoxylated bisphenol A derivatives, provided there is at least one free hydroxyl group to react with the isocyanate groups of the polyisocyanate.

Polyisocyanate compounds useful in preparing the fluorochemical compounds of the present invention comprise isocyanate radicals attached to the multivalent organic group ($R^1$) that can comprise a multivalent aliphatic, alicyclic, or aromatic moiety; or a multivalent aliphatic, alicyclic or aromatic moiety attached to a biuret, an isocyanurate, or a uretdione, or mixtures thereof. Preferred polyfunctional isocyanate compounds contain an average of at least two isocyanate (—NCO) radicals. Compounds containing at least two —NCO radicals are preferably comprised of di- or trivalent aliphatic, alicyclic, araliphatic, or aromatic groups to which the —NCO radicals are attached. Aliphatic di- or trivalent groups are preferred.

Representative examples of suitable polyisocyanate compounds include isocyanate functional derivatives of the polyisocyanate compounds as defined herein. Examples of derivatives include, but are not limited to, those selected from the group consisting of ureas, biurets, allophanates, dimers and trimers (such as uretdiones and isocyanurates) of isocyanate compounds, and mixtures thereof. Any suitable organic polyisocyanate, such as an aliphatic, alicyclic, araliphatic, or aromatic polyisocyanate, may be used either singly or in mixtures of two or more.

The aliphatic polyisocyanate compounds generally provide better light stability than the aromatic compounds. Aromatic polyisocyanate compounds, on the other hand, are generally more economical and reactive toward nucleophiles than aliphatic polyisocyanate compounds. Suitable aromatic polyisocyanate compounds include, but are not limited to, those selected from the group consisting of 2,4-toluene diisocyanate (TDI), 2,6-toluene diisocyanate, an adduct of TDI with trimethylolpropane (available as Desmodur™ CB from Bayer Corporation, Pittsburgh, Pa.), the isocyanurate trimer of TDI (available as Desmodur™ IL from Bayer Corporation, Pittsburgh, Pa.), diphenylmethane 4,4'-diisocyanate (MDI), diphenylmethane 2,4'-diisocyanate, 1,5-diisocyanato-naphthalene, 1,4-phenylene diisocyanate, 1,3-phenylene diisocyanate, 1-methoxy-2,4-phenylene diisocyanate, 1-chlorophenyl-2,4-diisocyanate, and mixtures thereof.

Examples of useful alicyclic polyisocyanate compounds include, but are not limited to, those selected from the group consisting of dicyclohexylmethane diisocyanate ($H_{12}$ MDI, commercially available as Desmodur™ available from Bayer Corporation, Pittsburgh, Pa.), 4,4'-isopropyl-bis(cyclohexylisocyanate), isophorone diisocyanate (IPDI), cyclobutane-1,3-diisocyanate, cyclohexane 1,3-diisocyanate, cyclohexane 1,4-diisocyanate (CHDI), 1,4-cyclohexanebis(methylene isocyanate) (BDI), dimmer acid diisocyanate (available from Bayer), 1,3-bis(isocyanatomethyl)cyclohexane ($H_6$ XDI), 3-isocyanatomethyl-3,5,5-trimethylcyclohexyl isocyanate, and mixtures thereof.

Examples of useful aliphatic polyisocyanate compounds include, but are not limited to, those selected from the group consisting of tetramethylene 1,4-diisocyanate, hexamethylene 1,4-diisocyanate, hexamethylene 1,6-diisocyanate (HDI), octamethylene 1,8-diisocyanate, 1,12-diisocyanatododecane, 2,2,4-trimethyl-hexamethylene diisocyanate (TMDI), 2-methyl-1,5-pentamethylene diisocyanate, dimer diisocyanate, the urea of hexamethylene diisocyanate, the biuret of hexamethylene 1,6-diisocyanate (HDI) (Desmodur™ N-100 and N-3200 from Bayer Corporation, Pittsburgh, Pa.), the isocyanurate of HDI (available as Desmodur™ N-3300 and Desmodur™ N-3600 from Bayer Corporation, Pittsburgh, Pa.), a blend of the isocyanurate of HDI and the uretdione of HDI (available as Desmodure™ N-3400 available from Bayer Corporation, Pittsburgh, Pa.), and mixtures thereof.

Examples of useful aralipathic polyisocyanates include, but are not limited to, those selected from the group consisting of m-tetramethyl xylylene diisocyanate (m-TMXDI), p-tetramethyl xylylene diisocyanate (p-TMXDI), 1,4-xylylene diisocyanate (XDI), 1,3-xylylene diisocyanate, p-(1-isocyanatoethyl)phenyl isocyanate, m-(3-isocyanatobutyl)phenyl isocyanate, 4-(2-isocyanatocyclohexyl-methyl)phenyl isocyanate, and mixtures thereof.

Preferred polyisocyanates, in general, include those selected from the group consisting of tetramethylene 1,4-diisocyanate, hexamethylene 1,4-diisocyanate, hexamethylene 1,6-diisocyanate (HDI), octamethylene 1,8-diisocyanate, 1,12-diisocyanatododecane, the biuret of hexamethylene 1,6-diisocyanate (HDI) (Desmodur™ N-100 and N-3200 from Bayer Corporation, Pittsburgh, Pa.), the isocyanurate of HDI (available as Desmodur™ N-3300 and Desmodur™ N-3600 from Bayer Corporation, Pittsburgh, Pa.), a blend of the isocyanurate of HDI and the uretdione of HDI (available as Desmodur™ N-3400 available from Bayer Corporation, Pittsburgh, Pa.), and the like, and mixtures thereof.

In general, the polyisocyanate, the nucleophilic perfluoropolyether compound(s) II, the nucleophilic silane compound, and a solvent are charged to a dry reaction vessel under nitrogen to make a solution, following the charge of a catalyst. The reaction mixture is heated, with a sufficient mixing, at a temperature, and for a time sufficient for the reaction to occur. The nucleophilic perfluoropolyether compound(s) and the nucleophilic ethylenically unsaturated compound may be used in any order of addition, or simultaneously. Progress of the reaction can be determined by monitoring the disappearance of the isocyanate peak in the IR at ~2100 cm$^{-1}$ from the reaction solution.

Depending on reaction conditions (e.g., reaction temperature and/or polyisocyanate used), a catalyst level of up to about 0.5 percent by weight of the reaction mixture may be used to effect the condensation reactions with the isocyanates, but typically about 0.00005 to about 0.5 percent by weight may be used, 0.02 to 0.1 percent by weight being preferred. In general, if the nucleophilic group is an amine group, a catalyst is not necessary.

Suitable catalysts include, but are not limited to, tertiary amine and tin compounds. Examples of useful tin compounds include tin II and tin IV salts such as stannous octoate, dibutyltin dilaurate, dibutyltin diacetate, dibutyltin di-2-ethylhexanoate, and dibutyltinoxide. Examples of useful tertiary amine compounds include triethylamine, tributylamine, triethylenediamine, tripropylamine, bis(dimethylaminoethyl) ether, morpholine compounds such as ethyl morpholine, and 2,2'-dimorpholinodiethyl ether, 1,4-diazabicyclo[2.2.2]octane (DABCO, Aldrich Chemical Co., Milwaukee, Wis.), and 1,8-diazabicyclo[5.4.0.]undec-7-ene (DBU, Aldrich Chemical Co., Milwaukee, Wis.). Tin compounds are preferred. If an acid catalyst is used, it is preferably removed from the product or neutralized after the reaction. It has been found that the presence of the catalyst may deleteriously affect the contact angle performance.

The nucleophilic perfluoropolyether compound $R^{PFPE}$—$X^1H$ (II), is used in an amount of 1 to about 50% molar equivalent to the total available isocyanate functional groups, preferably in an amount of 5 to about 30% molar equivalent to the total available isocyanate functional groups. The nucleophilic unsaturated compound may be used in an amount of 99 to about 50% molar equivalent of the total available isocyanate functional groups, preferably in an amount of 55 to about 95% molar equivalent of the total available isocyanate functional groups. The equivalent ratio of $R^{PFPE}$ groups to $R^{Unsatd}$ groups is 1:1 to 1:10.

The photocurable compositions generally comprise 0.1 to 5 parts by weight of the perfluoropolyether silane compound of Formula I relative to 100 parts by weight of the photoresist component. Preferably, the added perfluoropolyether compound is minimized not to affect any performance and propertied required as photoresist for current application except the low surface energy achieved for improved release for phototool during the lithographic process, and the final water and oil repellent for permanent top solder protective coating.

Photoresist compositions are well known in the art of semiconductor lithography and are described in numerous publications including DeForest, Photoresist Materials and Processes, McGraw-Hill Book Company, New York, Chapter 2, 1975 and Moreau, Semiconductor Lithography, Principles, Practices and Materials, Plenum Press, New York, Chapters 2 and 4, 1988, incorporated herein by reference.

Useful photoresists can also include positive photoresists that include a polymer that becomes soluble in a basic developer upon exposure to radiation and negative photoresists that cross-link and become insoluble upon exposure to radiation. A variety of photo-sensitive polymers may be used in photoresists. Examples include, but are not limited to, copolymers of methyl methacrylate, ethyl acrylate and acrylic acid, copolymers of styrene and maleic anhydride isobutyl ester, and the like. The thickness of the photoresist is typically from about 1 μm to about 50 μm. The photoresist is then exposed to ultraviolet light or the like, through a mask or phototool, crosslinking the exposed portions of the resist. The unexposed portions of the photoresist are then developed with an appropriate solvent until desired patterns are obtained. For a negative photoresist, the exposed portions are crosslinked and the unexposed portions of the photoresist are then developed with an appropriate solvent. All photoresists using phototool for generating patterns in lithographic process requires the release of phototool from photoresists.

Exemplary negative photoresists include UVN 30 (available from Rohm and Haas Electronic Materials), and FUTURREX negative photoresists, such as NR9-1000P and NR9-3000PY (available from Futurrex, Franklin, N.J.).

Suitable positive-working photoresists typically contain two components, i.e., a light-sensitive compound and a film-forming polymer. The light-sensitive compound undergoes photochemical alteration upon exposure to radiation. Single component systems which employ polymers that undergo chain scission upon exposure to radiation are known. Light-sensitive compounds typically employed in two-component photoresist systems are esters formed from o-quinone diazide sulfonic acids, especially sulfonic acid esters of naphthoquinone diazides. These esters are well known in the art and are described in DeForest, supra, pages 47-55, and in Moreau, supra, pages 34-52. Light-sensitive compounds and methods used to make such compounds are disclosed in U.S. Pat. Nos. 3,046,110, 3,046,112, 3,046,119, 3,046,121, 3,106,465, 4,596,763 and 4,588,670, all incorporated herein by reference. Exemplary positive photoresists include UV5 photoresist and Shipley 1813 photoresist (both available from Rohm and Hass Electronic Materials, Marlborough, Mass.).

Polymers most frequently employed in combination with positive-working photoresists, e.g., o-quinone diazides, are the alkali soluble phenol formaldehyde resins known as the novolak resins. Photoresist compositions containing such polymers are described in U.S. Pat. Nos. 4,377,631 and 4,404,272. As disclosed in U.S. Pat. No. 3,869,292, another class of polymers utilized in combination with light-sensitive compounds is homopolymers and copolymers of vinyl phenol. The process of the instant invention is especially useful for the purification of positive-working photoresist compositions, such as the vinyl phenol-containing photoresist compositions.

Negative-working resist compositions can also be purified in accordance with the invention and are well known in the art. Such photoresist compositions typically undergo random crosslinking upon exposure to radiation thereby forming areas of differential solubility. Such resists often comprise a polymer and a photoinitiator. One class of negative-working photoresists comprises, for example, polyvinyl cinnamates as disclosed by R. F. Kelly, Proc. Second Kodak Semin. Micro Miniaturization, Kodak Publication P-89, 1966, p. 31. Other negative-working photoresists include polyvinyl-cinnamate acetates as disclosed in U.S. Pat. No. 2,716,102, azide cyclized rubber as disclosed in U.S. Pat. No. 2,940,853, polymethylmethacrylate/tetraacrylate as disclosed in U.S. Pat. No. 3,149,975, polyimide-methyl methacrylate as disclosed in U.S. Pat. No. 4,180,404 and polyvinyl phenol azide as disclosed in U.S. Pat. No. 4,148,655.

Another class of photoresists for purposes of the invention are those positive and negative acid-hardening resists disclosed in U.S. Pat. No. 5,034,304 (Feely, EP Application No. 0 232 972). These photoresists comprise an acid-hardening polymer and a halogenated, organic, photoacid generating compound.

A special photoresist is a solder resist which is used as permanent protective coating for printed wiring boards. Since the requirements of solder resist as a permanent insulating for moisture resistance, electrochemical migration resistance, thermal shock resistance, heat resistance and chemical resistance in addition to good hardness, adhesion and long shelf life, the composition normally includes both thermosetting and photosetting components and correspondingly may need severe setting conditions which results as one of the stickiest photoresist for phototool to release. Solder resists include those disclosed in U.S. Pat. No. 4,888,269 (Sato et al.), U.S. Pat. No. 4,902,726 (Hayashi et al.), U.S. Pat. No. 5,009,982 (Kamayachi et al.), U.S. Pat. No. 5,055,378 (Miyamura et al.), U.S. Pat. No. 5,061,744 (Ogitani et al.), U.S. Pat. No. 5,753,722 (Itokawa et al.), U.S. Pat. No. 5,948,514 (Komori et al.), and U.S. Pat. No. 7,601,228 (Nishina et al.) each incorporated herein by reference. Of particular interest are those photocurable and thermosetting compositions disclosed in U.S. Pat. No. 5,770,347 (Saitoh et al.), U.S. Pat. No. 5,753,722 (Itokawa et al.) and U.S. Pat. No. 5,948,514 (Komori et al.), which may be compounded with silicone-polyether block copolymer to produce a photoresist that is cleanly and easily removed from the phototool after irradiation. Solder resists are commercial available, such as from Taiyo Ink Mfg. Co. Lid.

If desired, the photocurable composition of the photoresist composition may further comprise a thermosetting resin, especially for solder masks to provide a tougher coating with better adhesion. The thermoset resin may comprise or more members selected from among amino resins, cyclocarbonate compounds, blocked isocyanates, and epoxy resins.

Useful amino resins include such methylated melamine resins as the products of Sanwa Chemicals Co., Ltd. marketed under trademark designations of NIKALAC MW-30, NIKALAC MW-30M, NIKALAC MW-22, NIKALAC MW-22A, NIKALAC MS-11, and NIKALAC MX-750 and the products of Mitsui-Cytec LTD. marketed under trademark designations of Cymel 300, Cymel 301, and Cymel 350; such mixed alkylated melamine resins as the products of Sanwa Chemicals Co., Ltd. marketed under trademark designations of NIKALAC MX-40 and NIKALAC MX-470 and the products of Mitsui-Cytec LTD. marketed under trademark designations of Cymel 238, Cymel 235, and Cymel 232; such imino group type melamine resins as the products of Mitsui-Cytec LTD. marketed under trademark designations of Cymel 325, Cymel 327, and Cymel XV-514; such benzoguanamine type amino resins as the products of Sanwa Chemicals Co., Ltd. marketed under trademark designations of NIKALAC BL-60 and NIKALAC BX-4000, such urea type amino resins as the products of Sanwa Chemicals Co., Ltd. marketed under trademark designations of NIKALAC MX-121 and NIKALAC MX-201; such melamine resins possessing an ethylenically unsaturated bond as the product of Sanwa Chemicals Co., Ltd. marketed under trademark designation of NIKALAC MX-302, and reaction products of these amino resins with N-methylol (meth)acrylamide, for example. In these amino resins, the average amount of formaldehyde bound to each of the active hydrogen atoms of the amino group ($—NH_2$) is properly not less than 65%, preferably not less than 80%. If this average amount is less than 65%, the developability of the composition will be unduly low because of the self-condensation of a given amino resin. The average degree of alkylation effected on a methylol group formed by the reaction of an amino group with formaldehyde is properly not less than 70%, preferably not less than 90%. If this average degree of alkylation is less than 70%, no good developability of the coating film will be attained because a curing reaction tends to proceed and a thermal fogging tends to occur during the step of drying. The amino resins which satisfy the requirements mentioned above, possess numerous points of crosslinking, and impart more perfect properties to the coating film include NIKALAC MW-30, NIKALAC MW-30M, NIKALAC MW-22, NIKALAC MW-22A, NIKALAC MX-40, NIKALAC MX-301, Cymel 300, Cymel 301, and the reaction products of melamine resins as with N-methylol (meth)acryl amide, for example.

The compounds which are obtained by the reaction of carbon dioxide gas upon epoxy resins are included among the aforementioned cyclocarbonate compounds. The epoxy resins mentioned above include such well-known epoxy compounds as glycidyl ethers of the bisphenol A type, hydrogenated bisphenol A type, bisphenol F type, bisphenol S type, phenol novolak type, cresol novolak type, bisphenol A-based novolak type, biphenol type, and bixylenol type; triglycidyl isocyanurate; and glycidyl amines such as N,N,N',N'-tetraglycidyl methaxylene diamine and N,N,N',N'-tetraglycidyl bisaminomethyl cyclohexane. Among other epoxy resins cited above, such powdery epoxy resins as bixylenol diglycidyl ether and triglycidyl isocyanurate prove to be desirable from the view points of developability and tack-free touch of finger of the coating film. The cyclocarbonate compounds which are produced from these epoxy resins may be used either singly or in the form of a mixture of two or more members.

The blocked isocyanates mentioned above include oxime blocked products (compounds whose isocyanate groups are blocked with oximes), caprolactam blocked products, and dimethyl amine blocked products of such well-known diisocyanates as tolylene diisocyanate, hexamethylene diisocyanate, isophorone diisocyanate, diphenylmethane diisocyanate, and naphthalene diisocyanate, for example. These blocked isocyanates can be used either singly or in the form of a mixture of two or more members.

As the epoxy resin to be used as a thermosetting component mentioned above, any of such well-known epoxy resins as the epoxy resins of the bisphenol A type, hydrogenated bisphenol A type, bisphenol F type, bisphenol S type, phenol novolak type, cresol novolak type, bisphenol A-based novolak type, biphenol type, and bixylenol type; alicyclic epoxy resins; diglycidyl ethers of polyethylene glycol or polypropylene glycol; and triglycidyl isocyanurate may be used. The epoxy resins may be used either singly or in the form of a mixture of two or more members. Among other epoxy resins cited above, such powdery epoxy resins as triglycidyl isocyanurate prove to be desirable from the view point of developability of the coating film. Further from the viewpoint of their reactivity, solubility, and life of dried coating film, the triglycidyl isocyanurate of the high-melting type having three epoxy groups thereof oriented in one direction relative to the plane of the S-triazine skeleton proves to be particularly preferable among other species of triglycidyl isocyanurate.

The amount of the thermosetting component to be incorporated in the composition is desired to be in the range of from 5 to 40 parts by weight, preferably 10 to 30 parts by weight, based on 100 parts by weight of the photoresist. If the amount of the thermosetting component is less than 5 parts by weight based on 100 parts by weight of the photocurable resin, the characteristic properties such as adhesiveness to the substrate, resistance to soldering temperature, and resistance to chemicals which the cured coating film is expected to manifest will not be easily obtained. Conversely, if this amount exceeds 40 parts by weight, the thermosetting component except for the high-melting epoxy resin will suffer the disadvantage of incurring difficulty in obtaining a tack-free coating film.

The photoresist composition may optionally include a diluents such as water or an organic solvent. Examples of organic solvents include alcohols, e.g., methanol, ethanol, isopropanol, etc.; esters, e.g., ethyl acetate, ethyl lactate, etc.; cyclic ethers, e.g., tetrahydrofuran, dioxane, etc.; ketones, e.g., acetone, methyl ethyl ketone, etc.; alkylene glycol ethers or esters, e.g., ethylene glycol ethyl ether, ethylene glycol ethyl ether acetate, ethylene glycol dimethyl ether, diethylene glycol dimethyl ether, propylene glycol monomethyl ether acetate, etc.; cellosolves, carbitols, cellosolve acetates, carbitol acetates, and aromatic hydrocarbons. Among other organic solvents mentioned above, water-soluble organic solvents prove to be particularly desirable. The amount of the organic solvent to be used is desired to be not more than 50 parts by weight, preferably not more than 30 parts by weight, based on 100 parts by weight of the photoresist described above. Normally the solvent is removed by the application of heat after coating.

The photoresist compositions of the instant disclosure may optionally incorporate therein additionally a photopolymerizable monomer. The photopolymerizable monomers which are usable herein include hydroxyl group-containing acrylates such as 2-hydroxyethyl acrylate, 2-hydroxybutyl acrylate, pentaerythritol triacrylate, and dipentaerythritol pentaacrylate; acrylamide derivatives such as acrylamide and N-methylolacrylamide; water-soluble acrylates such as polyethylene glycol diacrylate and polypropylene glycol diacrylate; acrylates such as trimethylolpropane triacrylate and pentaerythritol tetraacrylate; and methacrylates corresponding to the acrylates mentioned above, for example. These photopolymerizable monomers may be used either singly or in the form of a combination of two or more members. Among other photopolymerizable monomers mentioned above, the hydrophilic group-containing (meth)acrylates prove to be particularly desirable in terms of liquid stability of the composition and the polyfunctional (meth)acrylates prove to be particularly desirable in terms of the photocuring properties. Further, such macromolecular compounds as polyvinyl alcohol, polyacrylamide, carboxymethyl cellulose, polyvinyl formal resin, and polyvinyl acetal resin which are water-soluble resins may be used as a protective colloid. The use of the protective colloid is effective in improving the liquid stability of the composition. Likewise for the purpose of improving the liquid stability of the composition, a surface-active agent may be used. From the viewpoints of electrical insulation properties, resistance to electrolytic corrosion, and liquid stability, the surface-active agent is desired to be of a nonionic type having an HLB (hydrophilic-lipophilic balance) value of not less than 13.

Optionally, such well-known and widely used inorganic fillers as barium sulfate, talc, silica, aluminum oxide, and aluminum hydroxide may be used for the purpose of enhancing the characteristic properties of the composition of the present invention such as adhesiveness to a substrate, hardness, and resistance to soldering temperature of the cured coating film. The amount of the inorganic filler to be used is desired to be in the range of not more than 100 parts by weight, preferably 5 to 50 parts by weight, based on 100 parts by weight of the photoresist composition. Further, well-known and widely used additives such as color pigments, thermopolymerization inhibitors, curing catalysts, thickening agents, anti-foaming agents, leveling agents, and coupling agents may be used, as occasion demands.

Polymerization or curing of the composition can be accomplished by exposing the composition to photo energy in the presence of a photoinitiator. These photoinitiators can be employed in concentrations ranging from about 0.0001 to about 3.0 part by weight (pbw), preferably from about 0.001 to about 1.0 pbw, and more preferably from about 0.005 to about 0.5 pbw, per 100 pbw of the photoresist component.

Useful photoinitiators include those known as useful for photocuring free-radically monomers. Exemplary photoinitiators include benzoin and its derivatives such as alpha-methylbenzoin; alpha-phenylbenzoin; alpha-allylbenzoin; alpha-benzylbenzoin; benzoin ethers such as benzil dimethyl ketal (e.g., "IRGACURE 651" from BASF, Florham Park, N.J.), benzoin methyl ether, benzoin ethyl ether, benzoin n-butyl ether; acetophenone and its derivatives such as 2-hydroxy-2-methyl-1-phenyl-1-propanone (e.g., "DAROCUR 1173" from BASF, Florham Park, N.J.) and 1-hydroxycyclohexyl phenyl ketone (e.g., "IRGACURE 184" from BASF, Florham Park, N.J.); 2-methyl-1-[4-(methylthio)phenyl]-2-(4-morpholinyl)-1-propanone (e.g., "IRGACURE 907" from BASF, Florham Park, N.J.); 2-benzyl-2-(dimethylamino)-1-[4-(4-morpholinyl)phenyl]-1-butanone (e.g., "IRGACURE 369" from BASF, Florham Park, N.J.) and phosphine oxide derivatives such as Ethyl-2,4,6-trimethylbenzoylphenylphoshinate (e.g. "TPO-L" from BASF, Florham Park, N.J.), and Irgacure 819 (phenylbis(2,4,6-trimethylbenzoyl) phosphine oxide) available from BASF, Florham Park, N.J.

Other useful photoinitiators include, for example, pivaloin ethyl ether, anisoin ethyl ether, anthraquinones (e.g., anthraquinone, 2-ethylanthraquinone, 1-chloroanthraquinone, 1,4-dimethylanthraquinone, 1-methoxyanthraquinone, or benzanthraquinone), halomethyltriazines, benzophenone and its derivatives, iodonium salts and sulfonium salts, titanium complexes such as bis(eta$_5$-2,4-cyclopentadien-1-yl)-bis[2,6-difluoro-3-(1H-pyrrol-1-yl) phenyl] titanium (e.g., "CGI 784DC" from BASF, Florham Park, N.J.); halomethyl-nitrobenzenes (e.g., 4-bromomethylnitrobenzene), mono- and bis-acylphosphines (e.g., "IRGACURE 1700", "IRGACURE 1800", "IRGACURE 1850", and "DAROCUR 4265").

The photocurable composition may be irradiated with activating UV or visible radiation to polymerize the components preferably in the wavelengths of 250 to 500 nanometers. UV light sources can be of two types: 1) relatively low light intensity sources such as blacklights that provide generally 10 mW/cm$^2$ or less (as measured in accordance with procedures approved by the United States National Institute of Standards and Technology as, for example, with a UVIMAP™ UM 365 L-S radiometer manufactured by Electronic Instrumentation & Technology, Inc., in Sterling, Va.) over a wavelength range of 280 to 400 nanometers and 2) relatively high light intensity sources such as medium- and high-pressure mercury arc lamps, electrodeless mercury lamps, light emitting diodes, mercury-xenon lamps, lasers, LED UV light sources, and the like, which provide intensities generally between 10 and 5000 mW/cm$^2$ in the wavelength rages of 320-390 nm (as measured in accordance with procedures approved by the United States National Institute of Standards and Technology as, for example, with a PowerPuck™ radiometer manufactured by Electronic Instrumentation & Technology, Inc., in Sterling, Va.).

The photocurable composition is often cured using a phototool to cure only selective portions of the photocurable composition. Phototools are typically made using a computer-aided design (CAD) system to prepare data for an exposure apparatus (for example, a photo-plotter) based on a target blueprint or data. Then, this data is used to perform direct writing of a designed pattern (for example, a circuit pattern) onto an emulsion photographic dry plate, which has been prepared by forming a film surface of a photosensitive emulsion layer on an optically clear substrate (for example, a glass substrate, fused silica or polyethylene terephthalate (PET), polycarbonate, or polymethylmethacrylate substrate). Optically clear substrates typically have low haze (for example, less than about 5% or even less than about 2%) and are substantially transparent (that is, they typically allow the passage of 95% or more (preferably 98% or more) of visible and ultraviolet light.

The photographic dry plate with the pattern thereon is then developed, fixed, washed in water, and dried. It may then be examined for defects and, if necessary, retouched. The photosensitive emulsion layer typically comprises a silver halide emulsion or a diazo emulsion. Thus, the film surface is relatively soft and easily scratched or marked, correspondingly, special care is needed to prevent any scratching. Chrome metal absorbing film may also be used.

If desired, the phototool may further comprise a release coating to further improve the release properties from photoresist comprising both cured and uncured parts to avoid or reduce any possible damage and reduce contamination, in addition to a durable protective hard coating to improve scratch and abrasion resistance. Thus the phototool may further comprise a coating such as that described in U.S. 2010/048751 (Qiu, incorporated by reference) comprising an epoxy silane and an oligomer of the formula $M^F M^E M^S$, where $M^F$ is a fluorinated (meth)acrylate, $M^E$ comprises an epoxy (meth)acrylate and $M^S$ comprises a silane (meth)acrylate. Alternatively the phototool can comprise a such as that described in US2010/048757 (Qiu, incorporated by reference) comprising an epoxy silane and an oligomer of the formula $M^F M^E M^A$, where $M^F$ is a fluorinated (meth)acrylate, $M^E$ comprises an epoxy (meth)acrylate and $M^A$ comprises a (meth)acrylate. Alternatively The phototool may comprise a hardcoat such as described in Applicant's copending U.S. Ser. No. 61/549,138, filed 19 Oct. 2011 (Qiu) comprising (a) an epoxy silane compound, (b) a reactive silicone additive, and (c) photo-acid generator. The reactive silicone additive has one of the following general structures:

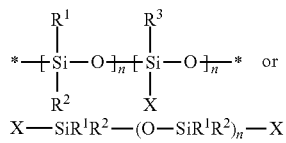

wherein:
$R^1$, $R^2$, and $R^3$ are independently a $C_1$-$C_6$ alkyl group or aromatic group with or without substitution;
X is a curable group selected from —OH, —OR, —OC(O)R, —OSiY$^1$Y$^2$Y$^3$, —CH$_2$CH$_2$-L-SiY$^1$Y$^2$Y$^3$ and R$_3$CO—, wherein R is a $C_1$-$C_4$ alkyl group, L is a divalent linkage group and Y$^1$, Y$^2$ and Y$^3$ are independently selected from $C_1$-$C_6$ alkyl groups and OR, and at least one Y is a curable group selected —OH, —OC(O)R and —OR, and n is at least 2 and m is at least 1 provided that the weight average molecular weight ($M_w$) of the reactive silicone additive is no more than about 4200.

The photoresist coating composition may be combined with a diluent to a viscosity suitable for a selected method of coating and applied to a substrate by such a method as the spray coating, curtain coating, screen printing, or roll coating. The applied layer of the composition may be dried to evaporate the diluent contained in the composition and to obtain a coating film having reduced tack. The spray coating method and the curtain coating method can be advantageously used particularly among other methods of coating. Desirably the coated photocurable composition is exposed to heat to evaporate the solvent and partially cure the composition, in embodiments comprising a thermosetting component.

A photomask or phototool may be affixed to the coated photocurable composition, typically by vacuum lamination. The coated photocurable composition is selectively exposed to an actinic radiation, such as UV radiation, through a phototool having a prescribed pattern formed therein. Examples of light sources which are advantageously used for the purpose of photocuring the composition include low-pressure mercury lamp, medium-pressure mercury lamp, high-pressure mercury lamp, ultra-high-pressure mercury lamp, xenon lamp, and metal halide lamp, for example. The laser beam may be utilized as the actinic radiation for exposure of the coating film. Besides them, electron beam, alpha rays, beta rays, gamma rays, X-rays, and neutron rays are likewise usable.

After exposure, the phototool may be removed from the pattern-transferred coating comprising both cured and uncured photoresist without any damage for repeated use. With the photocurable compositions of this disclosure, the phototool may be cleanly and easily removed from the exposed photocurable composition layer, even from the hardest solder resists.

The selectively pattern-cured coating is developed with a suitable developer. For negative resist compositions the developer removes the unexposed regions. For positive resist composition the developer removes exposed regions. For solder masks, the developed coating may be subject to an additional heating and/or UV exposure step to fully cure the coating. If the photoresist composition further comprises a thermoset resin, the resist film is subsequently thermally cured by being heated to a temperature in the range of from 140 to 180° C., for example, to further crosslink the thermosetting component.

As a result, the photocurable composition excels in such properties as adhesiveness to the substrate, hardness, resistance to soldering temperature, resistance to chemicals, electrical insulating properties, and resistance to electrolytic corrosion which is expected of a resist, and which may be cleanly removed from a phototool after exposure, can be obtained.

In some embodiments, this disclosure provides a multilayer article comprising a metallic substrate and a coating of the curable composition on at least one surface thereof. The coating may be uncured, fully cured or preferably partially cured. This disclosure further provides a method for making a coated metal article comprises forming a layer of the curable coating on a surface of a metal or metalized substrate by physical vapor deposition. As used herein, "metal or metalized substrate" refers to a substrate comprised of a metal and/or metal alloy, which is solid at room temperature. The metal and/or metal alloy can be selected, for example, from the group consisting of chromium, iron, aluminum, copper, nickel, zinc, tin, stainless steel, and brass, and the like, and alloys thereof. Preferably the metal is copper. The metallic layer may be formed on at least a portion of a surface of the substrate, such as a glass or polymeric substrates, by physical vapor deposition (PVD) using PVD methods known in the art.

EXAMPLES

Materials

TABLE 1

Raw Materials

| Material | Description | Source |
|---|---|---|
| N100 | Available under trade designation "Desmodur N-100" polyisocyanate—a triisocyanate-functional biuret derived from reacting 3 moles of 1,6-hexamethylene diisocyanate with 1 mole of water | Bayer Polymers LLC, Pittsburgh, PA |
| N3300 | Available under trade designation "Desmodur N-3300" Isocyanate—a triisocyanate-functional isocyanurate derived from trimerizing 3 moles of 1,6-hexamethylene diisocyanate | Bayer Polymers LLC, Pittsburgh, PA |
| MeFBSE | $C_4F_9SO_2N(CH_3)CH_2CH_2OH$ | 3M Company prepared as described in U.S. Pat. No. 6,664,354, Example 2, Part A. |
| $C_6F_{13}C_2H_4OH$ | $C_6F_{13}C_2H_4OH$ | Sigma-Aldrich, St. Louis, MO |
| HFPO—OH | $F(CF(CF_3)CF_2O)aCF(CF_3)$—$C(O)NHCH_2CH_2OH$ where "a" has an average value of 6.85 | 3M Company, prepared as described in U.S. Pat. No. 7,718,264, Preparation 4a |
| FBSEE | $C_4F_9SO_2N(CH_2CH_2OH)_2$ | 3M Company, prepared as described in U.S. Pat. No. 3,734,962 |
| SR444C | Pentaerythritol triacrylate available under the trade designation "SR444C" | Sartomer Company, Exton, PA |
| PI | $HOCH_2CH_2O$—Ph—$C(O)C(OH)Me_2$ | Sigma-Aldrich, St. Louis, MO |

TABLE 2

Solder Masks

| Solder Mask | Description | Source |
|---|---|---|
| SM-1 | Solder Mask-1, mixture of PSR-4000 AUS308 (Green) and Crosslink CA-40 AUS308 (hardener) 70/30 by weight | Both raw materials used in making SM-1 are available from Taiyo Ink Mfg. Co. Ltd., Tokyo, JP. Prepared as described under "Coating Formulation and Preparation" |
| SM-2 | Solder Mask-2), mixture of PSR-4000 AUS303 (Green) and Crosslink CA-40 AUS303 (hardener) 70/30 by weight | Same source and procedure as for SM-1 with different AUS ink. |

TABLE 3

Acrylate functionalized HFPO-polyurethanes

| Fluorinated Additive | Blend ratios or raw materials | Source |
|---|---|---|
| FA-1 | N100/MeFBSE/SR444C (30/15/15) | Prepared as described in Prep No. 10 of U.S. Pat. No. 7,718,264 with MeFBSE replacing $C_6F_{13}CH_2CH_2OH$ |
| FA-2 | N100/$C_6F_{13}C_2H_4OH$/SR444C (30/15/15) | Prepared as described in Prep No. 10 of U.S. Pat. No. 7,718,264 |
| FA-3 | N100/HFPO—OH/SR444C (100/10/95) | Prepared as described in Prep No. 6 of U.S. Pat. No. 7,718,264 but in a different ratio; |
| FA-4a | N100/HFPO—OH/SR444C (100/15/90) | Prepared as described in Prep No. 6 of U.S. Pat. No. 7,718,264 |
| FA-4b | N100/HFPO—OH/SR-444C (100/15/90) | Repeated preparation of FA-4a |
| FA-5 | N3300/HFPO—OH/SR444C (100/25/75) | Prepared as described in Prep No. 5.9 of U.S. Pat. No. 7,718,264 |
| FA-6 | N100/HFPO—OH/FBSEE/SR444C (30/7.5/10/12.5) | Prepared as described in Prep No. 12 of U.S. Pat. No. 7,718,264 |
| FA-7 | N100/HFPO—OH/SR444C/PI (30/10/10/10) | Prepared as described in Prep No. 5.11 in U.S. Pat. No. 7,718,264, but in different ratios |

TABLE 3-continued

Acrylate functionalized HFPO-polyurethanes

| Fluorinated Additive | Blend ratios or raw materials | Source |
|---|---|---|
| FA-8 | N100/HFPO—OH/SR444C/PI (30/5/15/10) | Prepared as described in Prep No. 5.11 of U.S. Pat. No. 7,718,264 |
| FA-9 | N3300/HFPO—OH/SR444C (30/10/20) | Prepared as described in Prep No. 5.10 of U.S. Pat. No. 7,718,264 |
| FA-10 | N3300/HFPO—OH/SR444C (30/15/15) | Prepared as described in Prep No. 5.11 of U.S. Pat. No. 7,718,264 |
| FA-11 | N100/ HFPO—OH/MeFBSE/SR444C (100/25/25/50) | Prepared as described in Prep No. 9 of U.S. Pat. No. 7,718,264 |
| FA-12 | HFPO—C(O)NH—CEt $(CH_2OC(O)NHC_2H_4OC(O)CMe=CH_2)_2$ | Prepared as described in Prep No. 23 of U.S. Pat. No. 7,718,264 |

Test Methods

Release

A 2.54 cm wide strip of "SCOTCH 610 CELLOPHANE TAPE" (3M Company, St. Paul, Minn.) was laminated to the sample coatings with two passes of a 2 kg rubber roller. An "IMAS SP2000" (IMASS Inc., Accord, Mass.) was utilized to peel the tape at an angle of 180 degrees and a speed of 2.3 m/min for 5 seconds. Peel force was measured. Tests were performed at 21° C. and 50% relative humidity. Three measurements were made from different locations and the mean reported. Release delta % is defined as below:

Release delta %=(Release-C−Release-E)/Release-C× 100% wherein, Release-C is the release of control solder ink without additive; and Release-E is the release of solder ink with additive.

Re-Adhesion

The tape strips utilized in the "Release" test were peeled and laminated to a clean stainless steel panel with two passes of a 2 kg rubber roller. An "IMASS SP2000" was used to peel the tape at an angle of 180 degrees and a speed of 30 cm/min for 10 seconds. Peel force was measured. Tests were performed at 21° C. and 50% relative humidity. Three measurements were made from different locations and the mean reported.

Contact Angle

Advancing, receding, and static contact angles were measured with a "KRUS DSA100" (Cruss GmbH, Hamburg, Germany). Measurements were made using reagent-grade hexadecane and deionized water, on a video contact angle system analyzer ("VCA-2500XE", AST Products, Billerica, Mass.). Reported values are the averages of measurements on 3 drops measured on the right and the left sides of the drops. Drop volumes were 5 microliters for static contact angle measurements and 1-3 microliters for advancing and receding contact angle measurements.

Coating Formulation and Preparation

Solder masks were formulated according to procedure described in the tech data sheet from Taiyo Ink Mfg. Co. Ltd., Tokyo, JP. The pre-measured ink and crosslinker (both available from Taiyo) were mixed in a beaker in 70:30 ratio by weight by hand with a mixing spatula for 10-15 minutes. Then, perfluoropolyether additive was added and mixed for an additional 10 minutes. The mixed solder mask was coated on primed polyethyleneterephthalate (PET) with a #30 wire rod. The coatings were dried in an 80° C. oven for 10 minutes, then irradiated with H-Bulb UV at 30 ft/min two times under nitrogen. The semi-settled solder mask coating was then ready for the release test.

Solder Mask with Acrylate Functionalized HFPO-polyurethanes

Different fluorinated polyurethanes with curable acrylate groups were formulated in two different solder inks and coated on PET as described in "Coating Formulation and Preparation". The semi-thermal cured/photo-cured coatings were tested for release performance as described under the "Release" test and the results summarized in Table 4. Example CE1 is the adhesion of "3M SCOTCH 610 TAPE" on stainless steel without touching solder mask and CE-2 and CE-5 are the controlled releases of SM-2 and SM-1 solder masks without additive. All formulations showed smooth quiet continuous release without any "shockiness" or discontinuous noisy release. As shown in Table 4, all perfluoropolyether based polyurethanes with acrylate functionalized groups demonstrated significant improvement of release performance of solder masks. Limited release performance was observed from short perfluoroalkylated polyurethane-acrylate additives (FA-1 and FA-2 in different solder inks; CE3, CE4, CE6 and CE7).

TABLE 4

Results

| Example | Solder Ink (99 wt %) | Additive (1% by wt) (Equivalent ratio) | Release (g/in) | Readhesion (g/in) | Release delta % |
|---|---|---|---|---|---|
| CE1 | None | None | NA | 576 | NA |
| CE2 | SM-2 | None | 660 | 418 | Control |
| CE3 | SM-2 | FA-1 | 572 | 393 | 13 |
| CE4 | SM-2 | FA-2 | 510 | 374 | 23 |
| EX1 | SM-2 | FA-3 | 27 | 425 | 96 |
| EX2 | SM-2 | FA-4a | 8 | 439 | 99 |
| EX3 | SM-2 | FA-4b | 12 | 435 | 98 |
| EX4 | SM-2 | FA-5 | 9 | 463 | 99 |
| EX5 | SM-2 | FA-6 | 17 | 374 | 98 |
| EX6 | SM-2 | FA-7 | 25 | 435 | 96 |
| CE5 | SM-1 | None | 760 | 418 | Control |
| CE6 | SM-1 | FA-1 | 628 | 355 | 17 |
| CE7 | SM-1 | FA-2 | 431 | 366 | 43 |
| EX7 | SM-1 | FA-8 | 14 | 458 | 98 |
| EX8 | SM-1 | FA-9 | 16 | 487 | 98 |
| EX9 | SM-1 | FA-10 | 22 | 482 | 97 |
| EX10 | SM-1 | FA-11 | 17 | 457 | 98 |
| EX11 | SM-1 | FA-12 | 22 | 414 | 97 |

Effect of Fluorinated Polyurethane Additive Amount on Solder Mask Release

For lower cost and less effect on the solder ink's original properties, the effect of additive amount on release performance was studied to identify the minimum level of additives. Additive levels of 0.5%, 0.25% and 0.1% in the solder ink were formulated, coated and semi-cured, and the representative release results were summarized in Table 5.

As shown in Table 5, perfluoropolyether based polyurethanes with acrylate functionalized groups demonstrated significant improvement in release performance of solder inks even at 0.1% by weight.

TABLE 5

| Example | Solder Mask (wt %) | Additive (wt %) | Release (g/in) | Readhesion (g/in) | Release delta % |
|---|---|---|---|---|---|
| CE1 | None | None | NA | 568 | NA |
| CE2 | None | None | 660 | 418 | Control |
| EX12 | SM-2, 99.90 | FA-4a, 0.10 | 21 | 415 | 97 |
| EX13 | SM-2, 99.75 | FA-4a, 0.25 | 12 | 432 | 98 |
| EX14 | SM-2, 99.50 | FA-4a, 0.50 | 11 | 429 | 98 |

Contact Angles of Solder Inks with Fluorinated Polyurethane Additives

To further confirm the effect of the fluorinated polyurethanes on solder ink, contact angles were measured for selected formulations from Table 5 and results summarized in Table 6. From the table it is clear that the presence of fluorinated polyurethanes increased both water and oil repellency indicating the migration of the fluorinated segment to the surface.

TABLE 6

| | | Contact Angles | | | | | | | | | | | |
|---|---|---|---|---|---|---|---|---|---|---|---|---|---|
| | | Water | | | | | | Hexadecane | | | | | |
| | | Advancing | | Receding | | Static | | Advancing | | Receding | | Static | |
| EX | Formulation | *L | *R | L | R | L | R | L | R | L | R | L | R |
| CE2 | SM-2 | 88 | 89 | 41 | 42 | 87 | 87 | 14 | 15 | 8 | 9 | 13 | 12 |
| EX12 | SM-2 0.1% FA-4a | 113 | 113 | 76 | 77 | 111 | 111 | 64 | 64 | 46 | 46 | 62 | 62 |
| EX13 | SM-2 0.25% FA-4a | 109 | 109 | 76 | 77 | 102 | 101 | 65 | 65 | 50 | 51 | 62 | 61 |
| EX14 | SM-2 0.5% FA-4a | 114 | 115 | 74 | 74 | 103 | 104 | 69 | 69 | 54 | 54 | 67 | 67 |

*L = Left, R—Right

This disclosure is illustrated with the following embodiments:

1. A photocurable composition comprising:
   a) a photoresist component, and
   b) a perfluoropolyether compound of the formula:

$(R^{PFPE}-X^1-CO-NH)_x-R^1-(NH-CO-X^2-R^{Unsatd})_y$,

Where
   $R^{PFPE}$ represents a perfluoropolyether group,
   $X^1$ and $X^2$ are independently —O—, —S— or —NR$^2$— where R$^2$ is H or $C_1$-$C_4$ alkyl,
   $R^1$ is a residue of a polyisocyanate,
   $R^{Unsatd}$ is a moiety containing an ethylenically unsaturated, polymerizable group, subscripts x and y are each independently 1 to 3, and
   c) a photoinitiator.

2. The photocurable composition of embodiment 1 wherein $R^{Unsatd}$ comprises a vinyl, allyl or a (meth)acryloyl group.

3. The photocurable composition of embodiments 1 or 2, comprising 0.1 to 5 parts by weight of the perfluoropolyether compound relative to 100 parts by weight of the photoresist component.

4. The photocurable composition of any of the previous embodiments wherein the photoresist component is a positive photoresist.

5. The photocurable composition of any of the previous embodiments wherein the photoresist component is a negative photoresist.

6. The photocurable composition of any of the previous embodiments wherein the photoresist component is a solder resist.

7. The photocurable composition of any of the previous embodiments wherein the perfluoropolyether group, $R^{PFPE}$, is of the formula:
   $R_f^1-O-R_f^2-(R_f^3)_q-$, wherein $R_f^1$ represents a perfluorinated alkyl group, $R_f^2$ represents a $C_1$-$C_4$ perfluorinated polyalkyleneoxy groups or a mixture thereof, $R_f^3$ represents a perfluorinated alkylene group and q is 0 to 1.

8. The fluorochemical urethane of embodiment 7 wherein $R_f^1$ is a monovalent perfluoroalkyl group comprising one or more perfluorinated repeating units selected from the group consisting of F—$C_nF_{2n}$—, F—(CF(Z)—, F—(CF(Z)$C_nF_{2n}$—, F—$C_nF_{2n}$CF(Z)—, F—CF$_2$CF(Z)—, and combinations thereof, wherein n is 1 to 4 and Z is a perfluoroalkyl group or a perfluoroalkoxy group.

9. The fluorochemical urethane of embodiment 7 wherein said perfluorooxyalkylene group is selected from one or more of —(CF$_2$—CF$_2$—O)$_r$—; —(CF(CF$_3$)—CF$_2$—O)$_s$—; —(CF$_2$CF$_2$—O)$_r$—(CF$_2$O)$_t$—, —(CF$_2$CF$_2$CF$_2$CF$_2$—O)$_u$ and —(CF$_2$—CF$_2$—O)$_r$—(CF(CF$_3$)—CF$_2$—O)$_s$—; wherein each of r, s, t and u are each integers of 1 to 50.

10. The photocurable composition of embodiments 1-9, wherein the equivalent ratio of $R^{PFPE}$ groups to $R^{Unsatd}$ groups is 1:1 to 1:10.

11. The photocurable composition of embodiment 1-10 wherein $R^1$ is an alkylene group, an arylene group or combination thereof, having a valence of x+y.

12. The photocurable composition of embodiments 1-11, wherein $R^{Unsatd}$ is of the formula:

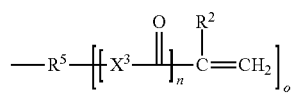

wherein
X² is —O—, —S— or —NR²—,
R² is H or $C_1$-$C_4$ alkyl,
R⁵ is a polyvalent alkylene or arylene groups, or combinations thereof, said alkylene groups optionally containing one or more catenary oxygen atoms;
n is 0 or 1, and
o is 1 to 5.

13 The photocurable composition of embodiment 12 wherein $R^{Unsatd}$ is derived from a partially (meth)acrylated polyol of the general formula:

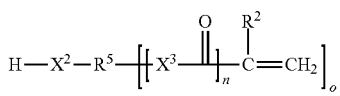
V wherein
X² is —O—, —S— or —NR²—,
R² is H or $C_1$-$C_4$ alkyl,
R⁵ is a polyvalent alkylene or arylene groups, or combinations thereof, said alkylene groups optionally containing one or more catenary oxygen atoms;
n is 0 or 1, and
o is 1 to 5.

14. The photocurable composition of embodiments 1 to 13 further comprising a thermoset resin in the amount from 5 to 40 parts by weight, based on 100 parts by weight of the photoresist component.

15. A multilayer article comprising
a) a metallic base substrate,
b) a phototool,
c) a layer of the photocurable layer of any of embodiments 1-14 disposed therebetween.

16. A multilayer article comprising
a) a printed circuit broad substrate,
b) a phototool,
c) a layer of the photocurable composition of any of the embodiments 1-14 disposed therebetween.

17. The multilayer article of embodiments 15 or 16, wherein the photocurable layer has been partially cured by heat and/or light exposure.

18. The multilayer article of embodiments 15 or 16 further comprising a hardcoat disposed on the surface of the phototool.

19. The partially-cured composition of embodiment 17 having release value less than 100 g/in (~39 g/cm) to 3M™ 610 Tape 20. The partially cured composition of embodiment 17 having static water contact angle of at least 90° and static hexadecane contact angle of at least 50°.

21. A multilayer article comprising
a) a printed circuit broad substrate,
b) a cured and developed layer of the composition any of embodiments 1-14 on a surface of the substrate.

What is claimed is:
1. A photocurable composition comprising:
a) a photoresist component, and
b) a perfluoropolyether compound of the formula:

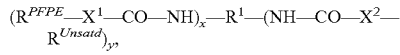

Where
$R^{PFPE}$ represents a perfluoropolyether group,
X¹ and X² are independently —O—, —S— or —NR²— where R² is H or $C_1$-$C_4$ alkyl,
R¹ is a residue of a polyisocyanate,
$R^{Unsatd}$ is a moiety containing an ethylenically unsaturated, polymerizable group, subscripts x and y are each independently 1 to 3, and
c) a photoinitiator.

2. The photocurable composition of claim 1 wherein $R^{Unsatd}$ comprises a vinyl, allyl or a (meth)acryloyl group.

3. The photocurable composition of claim 1, comprising 0.1 to 5 parts by weight of the perfluoropolyether compound relative to 100 parts by weight of the photoresist component.

4. The photocurable composition of claim 1 wherein the photoresist component is a positive photoresist.

5. The photocurable composition of claim 1 wherein the photoresist component is a negative photoresist.

6. The photocurable composition of claim 1 wherein the photoresist component is a solder resist.

7. The photocurable composition of claim 1 wherein the perfluoropolyether group, $R^{PFPE}$, is of the formula:
$R_f^1$—O—$R_f^2$—$(R_f^3)_q$—, wherein $R_f^1$ represents a perfluorinated alkyl group, $R_f^2$ represents a $C_1$-$C_4$ perfluorinated polyalkyleneoxy groups or a mixture thereof, $R_f^3$ represents a perfluorinated alkylene group and q is 0 to 1.

8. The fluorochemical urethane of claim 7 wherein $R_f^1$ is a monovalent perfluoroalkyl group comprising one or more perfluorinated repeating units selected from the group consisting of F—$C_nF_{2n}$—, F—(CF(Z)—, F—(CF(Z)$C_nF_{2n}$—, F—$C_nF_{2n}$CF(Z)—, F—$CF_2$CF(Z)—, and combinations thereof, wherein n is 1 to 4 and Z is a perfluoroalkyl group or a perfluoroalkoxy group.

9. The fluorochemical urethane of claim 7 wherein said perfluorooxyalkylene group is selected from one or more of
—($CF_2$—$CF_2$—O)$_r$—; —(CF($CF_3$)—$CF_2$—O)$_s$—;
—($CF_2CF_2$—O)$_r$—($CF_2$O)$_t$—, —($CF_2CF_2CF_2CF_2$—O)$_u$ and —($CF_2$—$CF_2$—O)$_r$—(CF($CF_3$)—$CF_2$—O)$_s$—; wherein each of r, s, t and u are each integers of 1 to 50.

10. The photocurable composition of claim 1, wherein the equivalent ratio of $R^{PFPE}$ groups to $R^{Unsatd}$ groups is 1:1 to 1:10.

11. The photocurable composition of claim 1 wherein R¹ is an alkylene group, an arylene group or combination thereof, having a valence of x+y.

12. The photocurable composition of claim 1, wherein $R^{Unsatd}$ is of the formula:

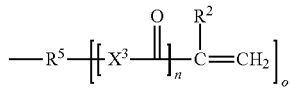

wherein
X³ is —O—, —S— or —NR²—,
R² is H or $C_1$-$C_4$ alkyl,
R⁵ is a polyvalent alkylene or arylene groups, or combinations thereof, said alkylene groups optionally containing one or more catenary oxygen atoms;
n is 0 or 1, and
o is 1 to 5.

13. The photocurable composition of claim 12 wherein $R^{Unsatd}$ is derived from a partially (meth)acrylated polyol of the general formula:

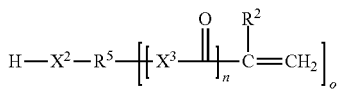

wherein
$X^3$ is —O—, —S— or —NR$^2$—,
$R^2$ is H or $C_1$-$C_4$ alkyl,
$R^5$ is a polyvalent alkylene or arylene groups, or combinations thereof, said alkylene groups optionally containing one or more catenary oxygen atoms;
n is 0 or 1, and
o is 1 to 5.

14. The photocurable composition of claim 1 further comprising a thermoset resin in the amount from 5 to 40 parts by weight, based on 100 parts by weight of the photoresist component.

15. A multilayer article comprising
a) a metallic base substrate,
b) a phototool,
c) a layer of the photocurable layer of claim 1 disposed therebetween.

16. A multilayer article comprising
a) a printed circuit broad substrate,
b) a phototool,
c) a layer of the photocurable composition of claim 1 disposed therebetween.

17. The multilayer article of claim 15, wherein the photocurable layer has been partially cured by heat and/or light exposure.

18. The multilayer article of claim 15 further comprising a hardcoat disposed on the surface of the phototool.

19. The partially-cured composition of claim 17 having release value less than 100 g/in (~39 g/cm) to 3M™ 610 Tape.

20. The partially cured composition of claim 17 having static water contact angle of at least 90° and static hexadecane contact angle of at least 50°.

21. A multilayer article comprising
a) a printed circuit broad substrate,
b) a cured and developed layer of the composition of claim 1 composition on a surface of the substrate.

* * * * *

UNITED STATES PATENT AND TRADEMARK OFFICE
CERTIFICATE OF CORRECTION

PATENT NO.          : 8,883,402 B2
APPLICATION NO.     : 13/921763
DATED               : November 11, 2014
INVENTOR(S)         : Douglas Fall Page 1 of 1

It is certified that error appears in the above-identified patent and that said Letters Patent is hereby corrected as shown below:

In the Specification:

Column 15,
Lines 38-42, delete

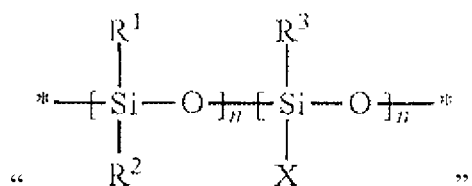

and insert

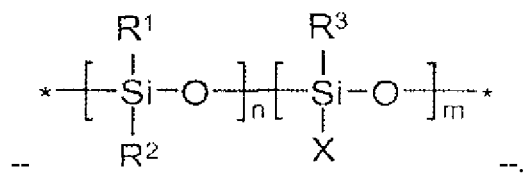

In the Claims:

Column 24,
Line 28, in claim 8, delete "fluorochemical urethane" and insert -- photocurable composition --.

Line 36, in claim 9, delete "fluorochemical urethane" and insert -- photocurable composition --.

Column 25,
Line 9, in claim 13, before "$X^3$" insert -- $X^2$ and --.

Signed and Sealed this
Fifth Day of May, 2015

*Michelle K. Lee*
Michelle K. Lee
*Director of the United States Patent and Trademark Office*